US006472030B1

(12) United States Patent  (10) Patent No.: US 6,472,030 B1
Balkus, Jr. et al.  (45) Date of Patent: Oct. 29, 2002

(54) PREPARATION OF LASER DEPOSITED ORIENTED FILMS AND MEMBRANES

(75) Inventors: Kenneth J. Balkus, Jr., The Colony; Mary E. Kinsel, Arlington; Lisa L. Washmon, Dallas, all of TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/804,622

(22) Filed: Mar. 12, 2001

Related U.S. Application Data

(63) Continuation of application No. 09/315,805, filed on May 21, 1999, now Pat. No. 6,287,645.
(51) Int. Cl.$^7$ .............................. C23C 14/00; B05D 3/14
(52) U.S. Cl. ..................... 427/597; 427/596; 427/561; 427/586; 427/600; 427/601; 427/212; 427/213; 427/215; 427/216; 427/217
(58) Field of Search ................................. 427/596, 597, 427/561, 586, 601, 600, 212, 213, 215, 216, 217

(56) References Cited

U.S. PATENT DOCUMENTS

| 5,220,099 A | 6/1993 | Schreiner et al. ............ 585/820 |
| 5,731,488 A | 3/1998 | Plee ............................ 585/820 |
| 5,828,542 A | 10/1998 | Riley et al. .................. 361/280 |

FOREIGN PATENT DOCUMENTS

| WO | WO 99/21923 | 5/1999 |

OTHER PUBLICATIONS

Peachey and Dye, "Pulsed laser deposition of zeolitic thin films; novel structures for molecular recognition," J. Porous Materials, 2:331–339, 1996.*

Munoz and Balkus, "Preparation of Oriented Zeolite UTD–1 Membranes via Pulsed Laser Ablation" J. Am Chem. Soc. 121: 139; 1988.*

Balkus et al., "Preparation of Zeolite UTD–1 Films by Pulsed Laser Ablation: Evidence for Oriented Crystal Growth," Chem. Mater., 10:464–466, 1998.*

Balkus, et al., "A Capacitance Type Chemical Sensor Based on $AlPO_4$–5 Molecular Sieves," Chem. Mater., 9(1):380–386, 1997.

Balkus et al., "Molecular Sieve Synthesis Using Metallocenes as Structure Directing Agents," Mater Res. Soc. Symp. Proc., 368:369–375, 1995.

Balkus et al., "Molecular Sieve Thin Films Via Laser Ablation," Mater Res. Soc. Symp. Proc., 351:437–442, 1994.

Balkus et al., "Synthesis and Characterazation of UTD–1: A Novel Zeolite Molecular Sieve," Chem. Ind., 69:77–91, 1996.

Balkus et al., "Titanium Modified UTD–1 as a Catalyst for Oxidation Reactions," Proc. of 12th Int. Zeolite Conf., 1403–1408, 1998.

Balkus et al., "Preparation of Zeolite UTD–1 Films by Pulsed Laser Ablation: Evidence for Oriented Crystal Growth," Chem. Mater., 10:464–466, 1998.

Balkus et al., "A Capacitance–type Chemical Sensor that employs VAPO–5, MnAPO–5 and MAPO–36 molecular sieves as the dielectric phase," Sens. Actuators B., 42:67–79, 1997.

(List continued on next page.)

Primary Examiner—Shrive P. Beck
Assistant Examiner—Jennifer Kolb Michener
(74) Attorney, Agent, or Firm—Fulbright & Jaworski, LLP

(57) ABSTRACT

A method of forming an oriented film. A target is provided and material from the target is ablated onto a substrate to form a film. The film is heated in a synthesis gel of the target material to orient the film.

9 Claims, 7 Drawing Sheets

OTHER PUBLICATIONS

Balkus et al., "The synthesis and characterization of UTD–1: The first large pore zeolite based on a 14 membered ring system" *Stud. Surf. Sci. Catal., 105:*415–421, 1997.

Balkus and Scott, "Zeolite Coatings on Three–Dimensional Objects via Laser Ablation," *Chem. Mater.,* 11(2):189–191, 1999.

Balkus et al., "Molecular sieve based chemical sensors," *Mater. Res. Soc. Symp. Proc.,* 371:33–38, 1994.

Balkus et al., "The preparation and characterization of $AlPO_4$ thin films via laser ablation of $AlPO_4-H_4$," *Thin Solid Films,* 260:4–9, 1995.

Barrett et al., "Structure of ITQ–4, a new pure silica polymorph containing large pores and a large void volume," *Chem. Mater.,* 9:1713–1715, 1997.

Bein, "Supramolecular Architecture: Tailoring Structure and Function of Extended Assemblies," *ACS. Symp. Ser.,* 499:1–7, 1992.

Bein, et al., "Molecular Sieve Sensors for Selective Detection at the Nanogram Level," *J. Am. Chem. Soc.,* 19:7640–7641, 1989.

Bein, "Synthesis and Applications of Molecular Sieve Layers and Membranes," *Chem. Mater.,* 8:1636–1653, 1996.

Belouet, "Thin film growth by the pulsed laser assisted deposition technique," *Appl. Surf. Sci.,* 96–98:630–642, 1996.

Bjorklund, et al., "Vapor Adsorption in Thin Silicalite–1 Films Studied by Spectroscopic Ellipsometry," *J. Phys. Chem. B.,* 102:2245–2250, 1998.

Boudreau and Tsapatsis, "A highly oriented thin film of Zeolite A," *Chem. Mater., 9:*1705–1709, 1997.

Chrisey and Hubler (Eds.), In: *Pulsed Laser Deposition of Thin Films,* Wiley, New York, 1994.

Coronas et al., "Characterization and permeation properties of ZSM–5 tubular membranes," *AIChE J., 43:*1797–1812, 1997.

Creasy, et al., "Molecular Design of Aluminosilicate Thin Film Devices," *Mater. Res. Soc. Symp. Proc.,* 233:157–167, 1991.

Davis et al., "Bacterial templating of ordered macrostuctures in silica and silica–surfactant mesophases," *Nature, 385:*420–423, 1997.

Dong and Lin, "In Situ Synthesis of P–Type Zeolite Membranes on Porous α–Alumina Supports," *Ind. Eng. Chem. Res.,* 6:2404–2409, 1998.

Edler and White, "Further Improvements in the long–range order of MCM–41 materials," *Chem. Mater., 5:*1226–1233, 1997.

Feng et al., "Morphology definition by disclinations and dislocations in a mesostructured silicate crystal," *App. Phys. Lett.,* 71(13):1887–1889, 1997.

Fitzgerald et al., "Novel method for controlling nano thin coatings on particulate matter," *Mat. Res. Soc. Symp. Proc.,* 526:105–110, 1998.

Freyhardt et al., "A High–silica Zeolite with a 14–tetrahedral–atom pore opening," *Nature,* 381:295–298, 1996.

Geus et al., "Synthesis and characterization of Zeolite (MFI) membranes on porous ceramic supports," *J. Chem. Soc., Faraday Trans.,* 88:3101–3109, 1992.

Gimon–Kinsel et al., "Photoluminescent properties of MCM–41 molecular sieves" *Micropor. Mater.,* 20:67–76, 1998.

Gimon–Kinsel and Balkus, "Pulsed laser deposition of mesoporous niobium oxide thin films and applications as chemical sensors," *Micropor. Mesopor. Mater., 28:*113–123, 1999.

Gouziniz and Tsaptasis, "On the Preferred Orientation and Microstructural Manipulation of Molecular Sieve Films Prepared by Secondary Growth," *Chem. Mater.,* 9:2497–2504, 1998.

Hedlun, et al., "Ultrathin oriented zeolite LTA films," *J. Chem. Soc. Chem. Commun.,* 13:1193–1194, 1997.

Hillhouse et al., "Preparation of supported mesoporous silica layers in a continuous flow cell," *Chem. Mater.,* 9:1505–1507, 1997.

Hopfe, et al., "Laser based coating and modification of carbon fibres: application of industrial lasers to manufacturing of composite materials," *Appl. Surf. Sci.,* 106:60–66, 1995.

Jansen et al., "Preparation of coatings of molecular sieve crystals for catalysis and separation," *Stud. Surf. Sci. Catal.,* 85:215–250, 1994.

Jansen et al., "Zeolitic coatings and their potential uses in catalysis," *Micropor. Mesopor. Mater.,*21:213–226, 1998.

Jia et al., "Ceramic–zeolite composite membranes and their application for separation of vapor/gas mixtures," *J. Membr. Sci.,* 90:1–10, 1994.

Karle, et al., "Zeolite Membranes from Kaolin," *Mater. Res. Soc. Symp. Proc.,* 431:237–244, 1996.

Karlsson et al., "Synthesis optimization of mesoporous MCM–41 materials in acidic media," *Mater. Res. Soc. Symp. Proc.,* 454:113–117, 1997.

Koegler et al., "Synthesis of films of oreinted silicalite–1 crystals using microwave heating," *Stud. Surf. Sci. Catal., 105:*2163–2170, 1997.

Kolsch et al., "Preparation and testing of silicalite–in–mental–membranes," *Stud. Surf. Sci. Catal., 84:*1075–1082, 1994.

Kondo et al., "Tubular–type pervaporation module with zeolite NaA membrane," *J. Membr. Sci.,* 133:133–141, 1994.

Kusakabe et al., "Preparation of MFI–type zeolite membranes and their use in separating n–butane and I–butane," *J. Chem. Eng. Jap.,* 30(1):72–78, 1996.

Larciprete, et al., "Organotin films deposited by laser–induced CVD as active layers in chemical gas sensors," *Thin Solid Films,* 323:291–295, 1998.

Lin and Mou, "Tubules–within–a–tubule Hierarchical order of mesoporous molecular sieves in MCM–41," *Science,* 273:765–768, 1996.

Liu et al., "Preparation of continuous mesoporous films on porous and dense substrates," *Mater. Res. Soc. Symp. Proc.,* 431:245–250, 1996.

Lobo et al., "Characterization of the extra–large–pore zeolite UTD–1," *J. Am. Chem. Soc.,* 119(36), 8474–8484, 1997.

Lovallo, et al., "Preparation of Supported Zeolite Films and Layers: Processing of Zeolite Suspensions and In Situ Growth From Homogenous Solutions," *Mater. Res. Soc. Symp. Proc.,* 431:225–236, 1996.

Lovallo et al., "Preparation of an Asymmetric Zeolite L Film," *Chem. Mater.* 8:1579–1583, 1996.

Lu et al., "Continuous formation of supported cubic and hexagonal mesoporous films by sol–gel dip–coating," *Nature,* 389:364–368, 1997.

Manne and Gaub, "Molecular organization of surfactants at solid–liquid interfaces," *Science,* 270:1480–1482, 1995.

Matsukata et al., "Zeolitic Membrane Synthesized on a Porous Alumina Support," *J. Chem. Soc. Chem. Comm.,* 339–340, 1994.

Matsukata, et al., "Preparation of a thin zeolitic membrane," *Stud. Surf. Sci. Cat.,* 84:1183–1190, 1994.

Medvecky et al., "Possibilities of coating of glass with synthetic zeolites," *Mater. Sci. Lett.,* 12:907–909, 1993.

Mintova, et al., "Nanosozed AIPO$_4$–5 Molecular Sieves and Ultrathin Films Prepared by Microwave Synthesis," *Chem. Mater.,* 10:4030–4036, 1998.

Mintova, et al., "In situ deposition of silicalite-1 on ZrO$_2$ fibres," *Mater. Sci. Lett.,* 10:840–841, 1996.

Mojie et al., "Growth of oriented zeolite crystal membranes," *Stud. Surf. Sci. Catal.,* 105:2233–2240, 1997.

Moller and Bein, "Inclusion chemistry in periodic mesoporous hosts," *J. Chem. Mater.,* 10:2950–2963, 1998.

Munoz and Balkus, "Preparation of oriented zeolite UTD–1 membranes via pulsed laser ablation," *J. Am. Chem. Soc.,* 121:139, 1999.

Munoz and Balkus, "Preparation of FeAPO–5 molecular sieve thin films and application as a capacitive type humidity sensor," *Chem. Mater.,* 10:4114–4122, 1998.

Nishiyama et al., "Mesoporous MCM–48 membrane synthesized on a porous stainless steel support," *J. Chem. Soc. Chem. Commun.,* 2147–2148, 1999.

Nishiyama et al., "A defect–free mordenite membrane synthesized by vapour–phase transport method," *J. Chem. Soc., Chem. Commun.,* 1967–1968, 1995.

Nishiyama et al., "Synthesis of FER membrane on an alumina support and its separation properties," *Stud. Surf. Sci. Catal.,* 105:2195–2202, 1997.

Ozin et al., "Nucleation, growth and form of mesoporous silica: role of defects and a language of shape," *Stud. Surf. Sci. Cat.,* 117:119–127, 1998.

Peachy and Dye, "Pulsed laser deposition of zeolitic thin films: novel structures for molecular recognition," *J Porous Materials,* 2:331–339, 1996.

Roser, et al., "X–Ray reflection studies on the monolayer––mediated growth of mesostructured MCM–41 silica at the air/water interface," *Chem. Commun.,* 829–830, 1998.

Sano et al., "New preparation method for highly siliceous zeolite films," *J. Mater. Chem.,* 2:141–142, 1992.

Sano et al., "Preparation and characterization of ZSM–5 zeolite films" *Zeolites,* 11:842–845, 1991.

Segal, et al., "Thin Films of Octahedral Molecular Sieves of Manganese Oxide," *Chem. Mater.,* 9, 98–104, 1997.

Tolbert, et al., "Magnetic field alignment of ordered silicate-surfactant composites and mesoporous silica," *Science,* 278:264–26, 1997.

Tsapatsis, et al., "Synthesis and Structure of Ultrafine Zeolite KL (LTL) Crystallites and their Use for Thin Film Zeolite Processing", *Mater. Res. Soc. Symp.,* 371:21–26, 1995.

Tsikoyiannis and Haag, "Synthesis and characterization of a pure zeolitic membrane" *Zeolites,* 12:126–130, 1992.

Wang, et al., "Very Low Temperature Deposition of Polycrystalline Si Films Fabricated by Hydrogen Dilution with Electron Cyclotron Resonance Chemical Vapor Deposition," *J. Appl. Phys.,* 28:927–931, 1995.

Xu et al., "A novel method for the preparation of Zeolite ZSM–5," *J. Chem. Soc. Chem. Commun.,* 755–756, 1990.

Yan and Bein, "Zeolite Thin Films with Tunable Molecular Sieve Function," *J. Am. Chem. Soc.,* 40:9990–9994, 1995.

Yan et al., "Zeolite ZSM–5 membranes grown on porous α–Al$_2$O$_3$," *Chem. Soc., Chem. Commun.,* 227–228, 1995.

Yan, et al., "Growth and Engineering of Microporous Zeolite Films and Coatings," *Mater. Res. Soc. Symp. Proc.,* 431:211–216, 1996.

Yang et al., "Synthesis of oriented films of mesoporous silica on mica," *Nature,* 379:703–705, 1996.

Yang et al., "Morphogenesis of shapes and surface patterns in mesoporous silica," *Nature,* 386:692–695, 1997.

Yang et al., "Thickness control and defects in oriented mesoporous silica films," *J. Mater. Chem.,* 8:1205–1211, 1998.

Zhao et al., "Synthesis of continuous mesoporous silica thin films with three–dimensional accessible pore structures," *Chem. Soc. Chem. Comm.,* 22:2499–2500, 1998.

Zhu et al., "Thickness and stability of adsorbed film in cylindrical mesopores," *J. Phys. Chem. B.,* 102:7371–7376, 1998.

\* cited by examiner

US 6,472,030 B1

PREPARATION OF LASER DEPOSITED ORIENTED FILMS AND MEMBRANES

This is a continuation of application Ser. No. 09/315,805, filed May 21, 1999, now U.S. Pat. No. 6,287,645.

The government may own rights in the present invention pursuant to grant number 009741-055, UTD Account No. 2-23206 from Texas Higher Education Coordinating Board—Advanced Technology Program.

BACKGROUND OF THE INVENTION

1. Field of the Invention

The present invention relates generally to the field of producing oriented films and membranes on a substrate. More particularly, it concerns a method of producing oriented films and membranes by pulsed laser deposition followed by a hydrothermal treatment.

2. Description of Related Art

Thin films composed of molecular sieves have attracted interest because of their potential applications in areas such as separations, catalysis, and sensors. Microporous molecular sieves are attractive materials for membrane-based applications, in part, because of the selective adsorption properties imparted by their uniform pore structure. Microporous molecular sieves offer several advantages over dense inorganic or polymeric thin-film materials which include, for example, high selectivity due to uniform pore size, thermal stability, and facile diffusion. Of particular interest are crystalline films that are oriented in such a way that specific pores define the exposed surface. Preferred crystal orientation offers several advantages in optimizing the efficiencies of gas separations as well as catalytic processes.

A variety of strategies have been developed for the fabrication of continuous films. The deposition and growth of crystals from solution onto a substrate is the most common approach, but this generally results in isolated crystals that must be grown sufficiently large so as to merge and form a continuous film. This aspect can make the preparation of thin films a challenge especially in the nanometer range. Recent efforts in controlling reaction conditions and the use of nanometer-sized seed crystals have improved the quality of some synthesized films and in some cases led to growth of oriented films. For the most part, however, these advancements have been limited to small and medium pore size zeolites such as those with the MFI and LTA topologies.

Many applications proposed for mesoporous molecular sieves would benefit from the ability to fabricate these materials into thin films. Previous attempts to prepare films of the hexagonal one dimensional channel type mesoporous silica, however, have only yielded films in which the pores are oriented parallel to the air/solution or substrate/solution interface.

SUMMARY OF THE INVENTION

In one respect, the invention is a method of forming an oriented film on a substrate. A target including a phosphate is provided. Material is ablated from the target onto the substrate to form a film. The film is heated in a synthesis gel of the target to orient the film. In another respect, the invention is a film made by this method.

In other aspects, the target may include an aluminum phosphate, a silicon aluminum phosphate, or a metal aluminum phosphate. The target may include at least one of VPI-5, $AlPO_4$-5, $AlPO_4$-8, SAPO-5, SAPO-37, SAPO-42, MAPO-39, MAPO-5, MAPO-11, UCSB-6, UCSB-7, or a mixture thereof. The film may be heated with the film being positioned face down at an angle between about 0 degrees and about 60 degrees in a reactor, the angle being measured from a plane horizontal to the reactor. The method may also include adjusting a background pressure of the substrate to between about 150 mTorr and about 350 mTorr. The background pressure may include a background pressure of $O_2$. The substrate may include a porous substrate. The substrate may include a zeolite crystal, glass, metal, metal oxide, or plastic. The method may also include separating liquids or gases with the film.

In another respect, the invention is a method of forming an oriented film on a substrate. A mesoporous target is provided. Material is ablated from the target onto the substrate to form a film, and the film is heated in a synthesis gel of the target to orient the film. In another respect, the invention is a film made by this method.

In other aspects, the target may include at least one of MCM-41, MCM-48, SBA-15, SBA-16, Nb-TMS-1, Ti-TMS-1, Ta-TMS-1, or a mixture thereof. The film may be heated with the film being positioned face down at an angle between about 0 degrees and about 60 degrees in a reactor, the angle being measured from a plane horizontal to the reactor. The method may also include adjusting a background pressure of the substrate to between about 150 mTorr and about 350 mTorr. The background pressure may include a background pressure of $O_2$. The substrate may include a porous substrate. The substrate may include a zeolite crystal, glass, metal, metal oxide, or plastic. The method may also include separating liquids or gases with the film.

In another respect, the invention is a method of forming an oriented film on a substrate. A target including a zeolite other than UTD-1 is provided. Material is ablated from the target onto the substrate to form a film, and the film is heated in a synthesis gel of the target to orient the film. In another respect, the invention is a film made by this method.

In other aspects, the target may include at least one of ZSM-5, Beta, Mordenite, NaX, NaA, SSZ-33, SSZ-31, SSZ-42, MCM-22, or a mixture thereof. The film may be heated with the film being positioned face down at an angle between about 0 degrees and about 60 degrees in a reactor, the angle being measured from a plane horizontal to the reactor. The method may also include adjusting a background pressure of the substrate to between about 150 mTorr and about 350 mTorr. The background pressure comprises a background pressure of $O_2$. The substrate may include a porous substrate. The substrate may include a zeolite crystal, glass, metal, metal oxide, or plastic. The method may also include separating liquids or gases with the film.

In another respect, the invention is a method of forming an oriented film on a substrate. A target including a zeolite other than UTD-1, the target also including $Cp*_2Co^+$ or $Cp_2Fe$, is provided. Pulsed laser radiation having an energy between about 70 mJ/pulse and about 200 mJ/pulse at a repetition rate of between about 1 Hz and about 50 Hz is directed to the target to create a plume. The substrate is heated. A pressure between about 150 mTorr and about 350 mTorr about the substrate is maintained. The substrate is placed in operative relation to the plume to deposit target material onto the substrate to form a film, and the film is heated in a synthesis gel of the target to form the oriented film.

In another respect, the invention is a method of forming an oriented phosphate film on a substrate. A target including a phosphate and CP*$_2$Co$^+$ or Cp$_2$Fe, is provided. Pulsed laser radiation having an energy between about 70 mJ/pulse and about 200 mJ/pulse at a repetition rate of between about 1 Hz and about 50 Hz is directed to the target to create a plume. The substrate is heated. A pressure between about 150 mTorr and about 350 mTorr about the substrate is maintained. The substrate is placed in operative relation to the plume to deposit target material onto the substrate to form a film, and the film is heated in a synthesis gel of the target to form the oriented film.

In another respect, the invention is a method of forming an oriented mesoporous film on a substrate. A target including a mesoporous molecular sieve and CP*$_2$Co$^+$ or Cp$_2$Fe, is provided. Pulsed laser radiation having an energy between about 70 mJ/pulse and about 200 mJ/pulse at a repetition rate of between about 1 Hz and about 50 Hz is directed to the target to create a plume. The substrate is heated. A pressure between about 150 mTorr and about 350 mTorr about the substrate is maintained. The substrate is placed in operative relation to the plume to deposit target material onto the substrate to form a film, and the film is heated in a synthesis gel of the target to form the oriented film.

In other aspects, the method may also include coupling a blank substrate adjacent the film prior to the heating the film. The method may also include inserting a spacer between the blank substrate and the film.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

Figure 1A:
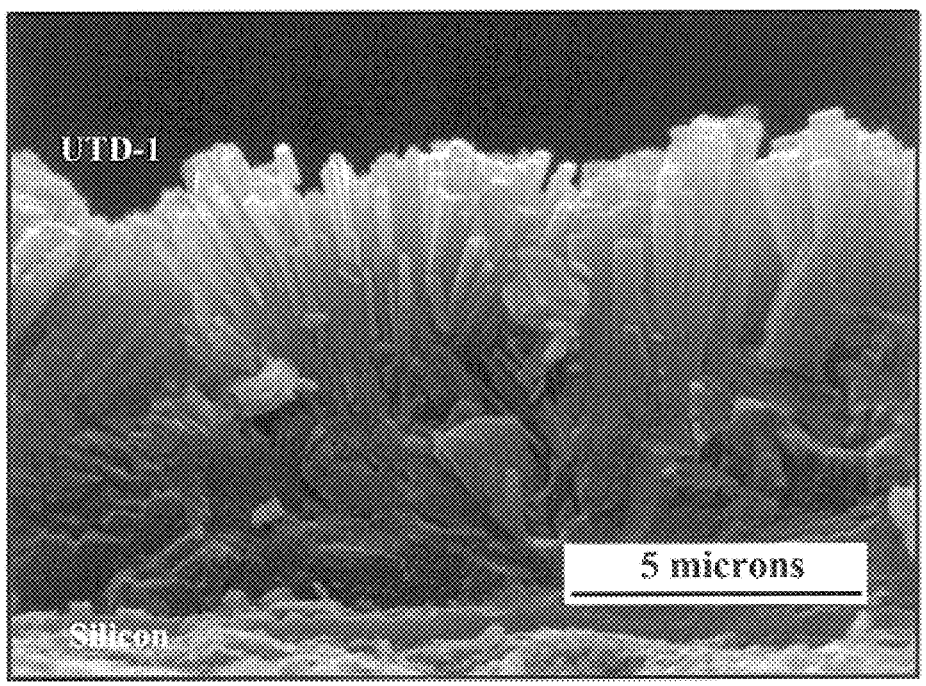
FIG. 1A SEM cross-section view of a UTD-1 film on silicon after hydrothermal treatment for 72 hours.

In embodiments described herein, a laser beam or other suitable source may be employed to strike a target to generate a plume that includes fragments of the target. The fragments of the target may be deposited on a temperature controlled substrate to form a laser-deposited film. That substrate may then be subjected to a hydrothermal treatment that re-organizes the film to form an oriented film. This method offers several advantages over previous synthesis methods. For instance, in one embodiment, the present disclosure allows for the preparation of well-adhered continuous and oriented films with control of the film thickness over a range of a few hundred nanometers to several microns depending on the experimental parameters.

In one embodiment, pulsed laser ablation may be utilized to prepare molecular sieve films of various materials, including partially or completely oriented films of the large-pore zeolite UTD-1, phosphate based molecular sieves, and mesoporous materials. It will be understood with the benefit of the present disclosure, however, that a variety of other materials including zeolites such as ZSM-5, Beta, Mordenite, NaX, NaA, SSZ-33, SSZ-31, SSZ-42, MCM-22; aluminum phosphates such as VPI-5, AlPO$_4$-5, AlPO$_4$-8; silicon aluminum phosphates such as SAPO-5, SAPO-37, SAPO-42; metal aluminum phosphates such as MAPO-39, MAPO-5, MAPO-11, UCSB-6, UCSB-7; mesoporous molecular sieves such as MCM-41, MCM-48, SBA-15, SBA-16, Nb-TMS-1, Ti-TMS-1, and Ta-TMS-1 may be used to form a film as well. Thus, although description herein may be directed to UTD-1 films or MAPO-39 films (or some other materials) for convenience, those having skill in the art will understand that the description applies to many other materials and mixtures of materials as well, such as, but not limited to, the materials listed above. Targets used in methods described herein may include an ultraviolet absorbing material including, but not limited to, the organometallic cobalticinium ion Cp*$_2$Co$^+$ or the related ferrocene Cp$_2$Fe to facilitate ablation. It will be understood that other UV absorbing materials suitable for aiding in ablation may be substituted therewith. It will also be understood that substrates my be manipulated in a plume to coat three dimensional or irregular substrates as disclosed in U.S. copending application Ser. No. 09/316,322 filed May 21, 1999 entitled "Method of Coating Three Dimensional Objects with Molecular Sieves" by Kenneth J. Balkus, Jr., Mary E. Kinsel, and Ashley S. Scott, now U.S. Pat. No. 6,274,207, which is incorporated herein by reference in its entirety.

UTD-1 is a high-silica molecular sieve having a one-dimensional (1-D) channel system where the pores are defined by 14 tetrahedral (T) atoms with dimensions of 10 ×7.5 Angstroms. Because UTD-1 is the largest pore zeolite known, it is an attractive material for use in several thin film applications. The structure of UTD-1 involves 1-D channels that run parallel to each other. Practical applications involving UTD-1 (e.g., applications involving separations, catalysis, and sensors) may benefit more from a UTD-1 film exhibiting channels that run perpendicular to the substrate.

An all-silica version of a UTD-1 target may be synthesized using the structure-directing agent bis (pentamethylcyclopentadienyl)cobalt(III) hydroxide as is known in the art. The as-synthesized UTD-1 (containing template) crystals may be pressed into a free standing solid pellet having a dimension of about, in one embodiment, 2.5 cm in diameter. The UTD-1 target may be composed of planklike bundles of yellow crystals about 5 to 10 μm in length.

In one embodiment, the molecular sieve target may be placed into a controlled-atmosphere chamber. In one embodiment, the target may be positioned about 2.5 cm above a substrate. The substrate may be, for instance, a polished substrate of various materials, such as a polished silicon substrate, or a porous substrate of various materials. Substrates may be various materials and may include, but are not limited to, zeolite crystals, glass, metal, metal oxide, or plastics. Substrates may be of various configurations including, but not limited to, flat substrates or substrates having a non-planar topology. Substrates may be of any shape and/or size suitable for applying a coating by the methods described herein. In one embodiment, substrates may include fibers, such as optical fibers.

The UTD-1 pellet may then be subjected to a source of radiation suitable to cause ablation of the pellet. In one embodiment, an excimer laser (KrF*, 248 nm) with an energy output of about 70–150 mJ/pulse and a repetition rate of about 10 Hz may be used.

Fragments from the target may be deposited or otherwise placed onto the substrate. To deposit well-adhered UTD-1 material from an ablation plume, the substrate temperature, background pressure, and deposition time may be controlled. In an embodiment utilizing a polished silicon substrate, the substrate may be heated to about 160° C., and a background pressure of $O_2$ may be maintained at about 150 mTorr, although higher and lower pressures (and different process conditions in general) may also be sufficient to form well-adhered films.

In one embodiment, a uniform, continuous, as-deposited film derived from UTD-1, may be deposited according to the present disclosure. The as-deposited film UTD-1 may appear to be largely amorphous by powder X-ray diffraction (XRD). Regardless of the nature of the UTD-1 fragments, they may be reorganized and may act as seed layers or nucleation sites for recrystallization of films in accordance with the present disclosure.

In order to improve crystallinity, laser-deposited films may also be hydrothermally treated, if desired. In one embodiment utilizing a polished silicon substrate, a wafer coated with a laser-deposited UTD-1 film may be placed in a reactor containing a UTD-1 synthesis gel at an elevated temperature for a period of time. In one embodiment, a Teflon-lined Parr reactor containing a UTD-1 synthesis gel at about 175° C. may be used. In this embodiment, the film may be placed in the gel for about 3 days under static conditions. The substrate may be positioned in the Teflon liner tilted at an angle. In one embodiment, an angle of about 60° (measured relative to a horizontal) may be used, and the laser-deposited film may face down so as to avoid having material deposit directly from the gel onto the wafer as opposed to reorganizing the as-deposited film surface. After the hydrothermal treatment, the coated substrate may be removed from the reaction vessel and washed. In one embodiment, deionized water may be used as a washing agent.

Different hydrothermal treatment times may be employed in preparing films. In an example of one embodiment, UTD-1 films laser deposited on silicon were placed in a Teflon-lined Parr reactor containing a UTD-1 synthesis gel at about 175° C. for 18, 24, and 72 hours under static conditions. The silicon substrates were positioned in an autoclave at an angle of about 60°, with the laser-deposited film facing down so as to avoid having UTD-1 material from the gel solution deposit directly onto the wafer.

After an 18 hour hydrothermal treatment, the coated substrate was removed from the reaction vessel and washed with deionized water. Powder X ray diffraction showed that crystalline material was beginning to form on the laser-deposited film having a thickness of about 30 $\mu$m grown from the approximately 700 nm thick PLD film. The gel mixture after 18 hours was amorphous with no indication of solids in the reaction vessel.

After 24 hours, more of a continuous crystalline film with a thickness of about 5 $\mu$m was observed. Planklike crystals began to form, which is typical of bulk UTD-1 crystals as well as what visually appeared to be an orientation with the planklike crystals beginning to grow perpendicular to the substrate. In both the 18 and 24 hour hydrothermal treatments there was no evidence of bulk UTD-1 formation since no solid material was observed in the reaction vessel, which supports reorganization of the laser-deposited film.

Figure 1B:
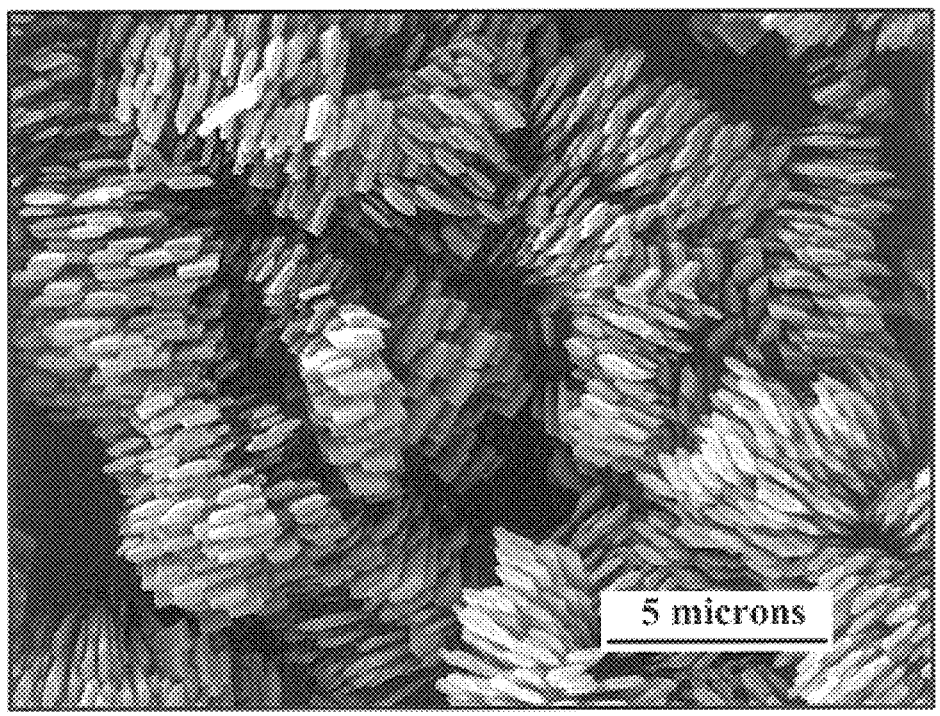
FIG. 1B A SEM surface view of a UTD-1 film after hydrothermal treatment for 72 hours.

After heating for 72 hours in the gel, a continuous UTD-1 film approximately 11 $\mu$m thick had grown from the laser-deposited film as shown in the SEM in FIGS. 1A and 1B. The morphology of the film appeared to be similar to what is observed for bulk UTD-1 material, which is generally composed of planklike bundles of crystals. It appeared from the SEM that the UTD-1 crystals radiated up from the laser-deposited film where the one-dimensional channels are oriented perpendicular to the substrate along the length of the b-axis of the crystals. After this time there were crystals in the bulk gel such that UTD-1 crystals were loosely deposited on the reverse side of the silicon wafer that were easily be flaked off.

It may therefore be concluded that the laser-deposited surface may sometimes be necessary to grow well adhered and oriented UTD-1 films. The laser-deposited UTD-1 film may provide nucleation sites which allow UTD-1 to grow quickly under hydrothermal treatment conditions. Generally, UTD-1 nucleates very slowly, i.e. there was no evidence of crystal growth up to 48 hours of heating, whereas the PLD UTD-1 films exhibit crystallinity after heating for as little as 18 hours with no evidence of crystal formation in the bulk gel even after 24 hours.

The orientation of the zeolite UTD-1 film may be verified by analysis techniques known in the art. For instance, x-ray diffraction (XRD) patterns may be used for verification. Although the exact mechanism of the oriented zeolite crystal growth is not perfectly clear, experiments have been performed in an attempt to improve understanding. A blank experiment has been conducted to explore the role of the laser ablation on the film growing process. A silicon wafer without a laser-deposited film was placed in a UTD-1 synthesis gel at about 175° C. for about 3 days. A film of UTD-1 crystals coating the polished side of a blank silicon wafer was obtained; however, the crystals were randomly oriented, and the film easily flaked off the substrate. In contrast, the UTD-1 film grown from the laser-deposited surface was oriented and well adhered to the silicon surface. It therefore it may be concluded that the laser-deposited surface may sometimes be necessary to grow well adhered and partially oriented films.

It should also be noted that a UV absorbing material such as an organometallic template $Cp^*_2Co^+$, or any other suitable material, occluded in UTD-1 may sometimes be necessary in both the target and ablated films in order to grow an oriented film. The organometallic absorber may be transferred to the substrate during laser ablation and must be partially occluded in the UTD-1 fragment. In an effort to verify this for UTD-1 and further evaluate the role of the template in the reorganization step, a sample of UTD-1 was calcined to decompose the organometallic and then washed with HCl to remove the cobalt from the pores. Laser irradiation of the calcined UTD-1 sample resulted in no ablation of the zeolite target. Those areas of the calcined pellet that were laser irradiated showed a green luminescence when placed under a UV lamp. The absorption of the excimer laser energy apparently produced defect sites in the molecular sieve. In the as-synthesized UTD-1 target, the organometallic guest may serve to absorb the UV excimer irradiation and assist in the ablation of the molecular sieve material from the solid to the gas phase. Ablation facilitated by a material such as $Cp^*_2Co^+$, or, for instance, another UV absorber, may be referred to as guest-assisted laser ablation (GALA).

A study on the surface crystallization of silicalite and ZSM-5 on different supports found that the adjustment of the synthesis conditions may control the orientation of the crystals to a certain extent, such that for high silica concentrations a gel layer was formed at the substrate which regulated crystal growth and the resulting crystals were oriented parallel to the substrate. At low concentration of silica and at low temperature, the c-axis of the MFI crystals was shown to grow mostly normal to the support. This may be the result of the low concentration of silica in the mixture that does not allow for the formation of a gel layer on the support.

In some of the embodiments described herein, oriented crystal growth may occur not from a smooth clean surface but from a densely packed film on a support composed of fragments deposited by pulsed laser ablation. These template-containing fragments may allow the surface to retain a memory effect and thereby may provide seeds or nucleation sites for crystal growth to occur. It seems that the PLD film may not be pre-oriented, since after 18 hours of hydrothermal treatment, the emerging crystalline film was not highly oriented. Even after 24 hours a more crystalline and continuous film was formed, but the orientation was only beginning to develop.

A factor in growing oriented PLD UTD-1 films may be the crystal morphology where the planklike crystals having an aspect ratio of b>>a>c are generally observed. As the tightly packed PLD layer of UTD-1 fragments reorganize, the crystal growth may take the path of least resistance perpendicular to the substrate. Fortunately, this orients the channels normal to the surface. In contrast, UTD-1 crystals deposited from solution on a clean surface may grow randomly oriented because the nucleation sites are in solution not crowded on a PLD surface.

The apparent increase in UTD-1 crystal orientation as the thickness increases is consistent with the idea that as the nuclei crystallizes, the forest of crystals thickens and upward growth is dictated. This phenomenon may be the opposite of other known oriented films, such as zeolite films, where an initial seed layer deposited from solution is oriented by virtue of nanocrystal packing but subsequent crystal growth becomes random as the film thickness increases.

An oriented large pore molecular sieve like UTD-1 may be an attractive material in areas including, but not limited to, gas separation and catalysis. For other practical purposes, the material may be useful if placed upon a porous support. UTD-1 and other materials may be laser ablated onto a porous stainless steel support. UTD-1 materials may coat the surface of the pores, which, in one embodiment may be about 500 nm, with fragments of UTD-1 embedded in the channels and cavities of the support.

Figure 2A:
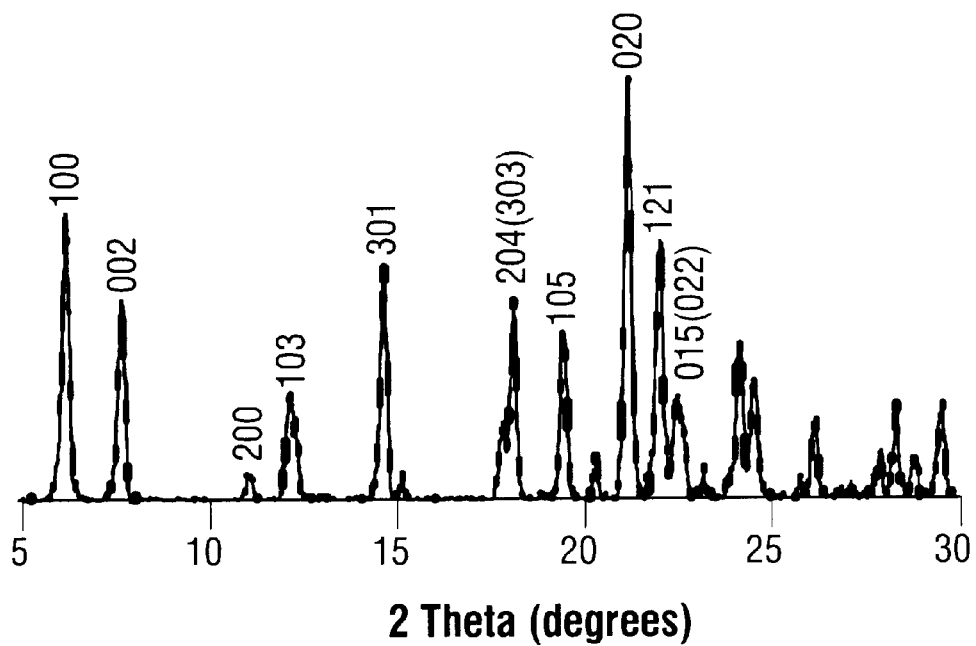
FIG. 2 X-ray diffraction patterns of UTD-1 (A) as-synthesized bulk and (B) a calcined membrane on porous stainless steel.
Figure 2B:
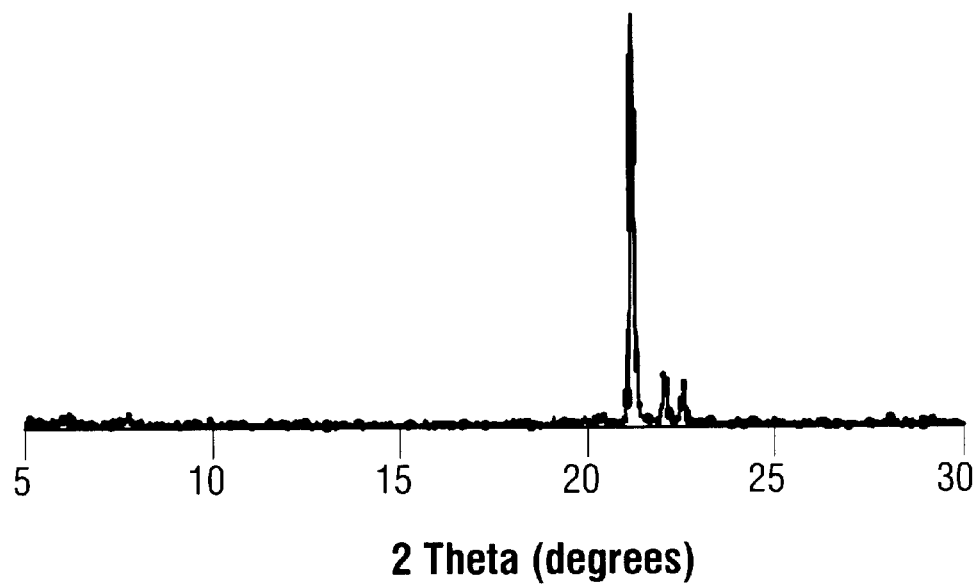

The stainless steel disk may be subjected to a post hydrothermal treatment for, in one embodiment, about 72 hours. A densely packed membrane of UTD-1 crystals growing perpendicular to the porous support for this embodiment is formed Powder x-ray analysis of the membrane showed dramatic changes in the relative peak intensities. FIG. 2 shows the diffraction patterns of the bulk as-synthesized UTD-1 and a calcined UTD-1 membrane on porous stainless steel, respectively. Similar to the oriented film grown on silicon, the diffraction pattern of the membrane exhibited a large increase in relative intensity of the 020 reflection while most of the (h0l) reflections were depressed. Again, this result is consistent with an orientation of the crystals emanating from the laser-deposited surface where the direction of the channels (i.e., b-axis) are mostly perpendicular to the porous support.

Figure 3A:
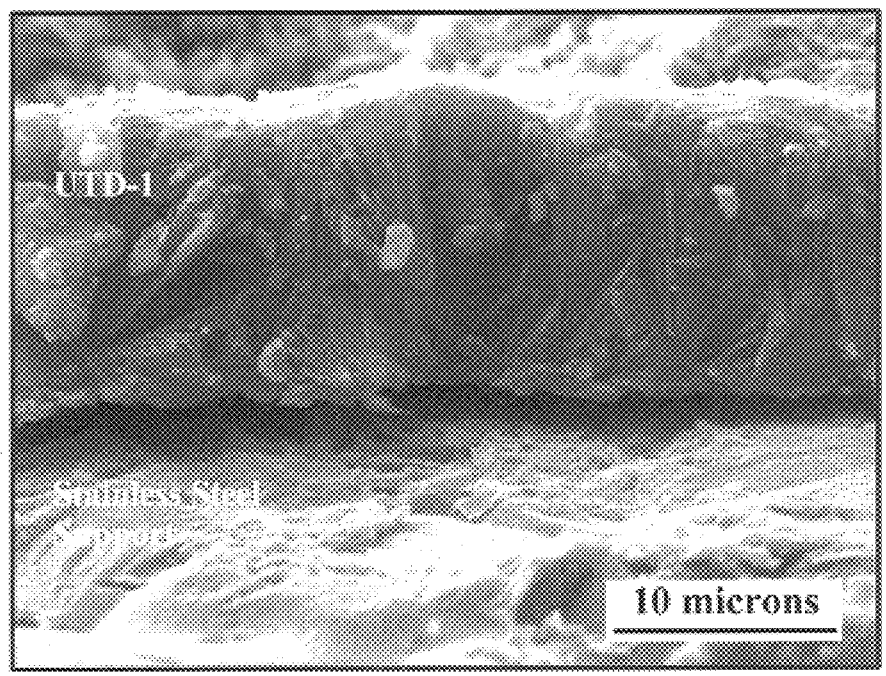
FIG. 3A SEM cross-section view of a UTD-1 membrane grown on a stainless steel porous support.
Figure 3B:
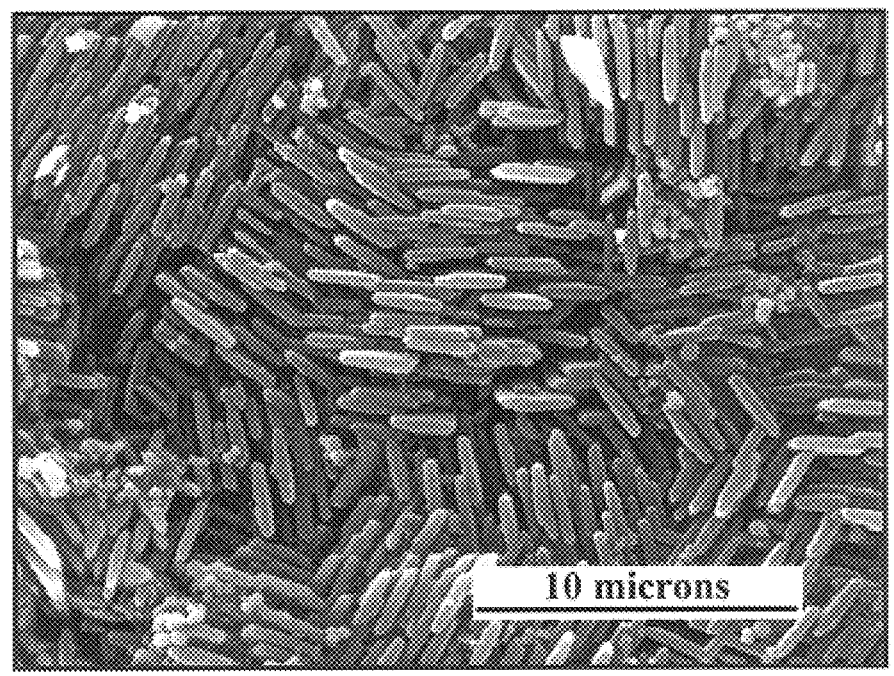
FIG. 3B An SEM top view of a UTD-1 membrane grown on a stainless steel porous support.

FIG. 3A shows an SEM of oriented UTD-1 grown on a stainless steel support that has been cut away revealing a continuous film with a thickness of about 14 $\mu$m and a top view of the membrane in FIG. 3B. Close inspection of the film revealed that the crystals were mostly oriented perpendicular to the substrate from the top to the base of the membrane.

For such an oriented membrane to be useful, particularly in gas separations, it may be desirable to remove the organometallic template occupying the pores. Calcination may pose a problem with supported membranes, for example, at temperatures up to about 500° C., which can cause thermal stress and lead to partial destruction of the membrane. After calcination of a UTD-1 membrane on the porous support at about 550° C. for about 8 hours, however, a powder XRD exhibited no decrease in crystallinity or orientation. Tests for cracks or defects generated by this treatment may be performed by attempting a model separation.

In one embodiment, oriented MAPO-39 molecular sieve thin films may also be prepared by using pulsed laser ablation in accordance with the present disclosure. Applications of such thin films may include, but are not limited to, chemical sensors, catalysis and separations. Oriented MAPO-39 zeolite thin films may be used as a membrane for separations of liquids or gases, in the area of catalysis, or as a chemical sensor. Oriented MAPO-39 zeolite thin films may be deposited onto virtually any substrate, including porous metal supports for use as a membrane in gas or liquid mixture separations in accordance with the present disclosure.

Production of thin, oriented MAPO-39 films according to this disclosure involves pulsed laser deposition followed by post hydrothermal treatment as described herein. Post hydrothermal treatment may include heating a thin-film coated substrate in a reaction gel used to synthesize the mesoporous molecular sieve. One step of oriented MAPO-39 zeolite film preparation may involve the removal of the templating agent. Template removal, in one embodiment, may be achieved by calcination or washing with an appropriate acid solution.

In one embodiment, pulsed laser ablation with a 248 nm KrF* laser may be used to form an oriented MAPO-39 film. Laser fluence may be about 60 MW/cm$^2$, and the repetition rate may be about 10 Hz. Various substrates may be used, including, but not limited to, polished silicon and porous metal disks. The substrate temperature may be, in one embodiment, about 150° C. to about 200° C., and the background pressure may be from about 175 mTorr to about 300 mTorr with $O_2$. Ablation time may be, in one embodiment, from about 6 to about 16 minutes.

In another embodiment, MAPO-39 films may be reorganized by hydrothermal treatment in a synthesis gel under heating conditions. In one embodiment, a film may be placed into a synthesis gel at an angle of about 40 degrees, with the ablated side facing down in the synthesis gel. The gel may be placed in a high pressure reactor and may be heated under static conditions at about 150° C. for about 24 hours. After post hydrothermal treatment, the thin film may be washed with water and allowed to air dry. SEM images of the film resulting from post hydrothermal treatment has revealed crystals growing normal to the substrate. Powder x-ray diffraction of the post hydrothermally treated films has also provided evidence for crystal growth primarily along the c axis.

In one embodiment, silica mesoporous MCM-41 molecular sieve films including oriented macroporous tubules may also be prepared by using pulsed laser ablation in accordance with the present disclosure. The molecular sieve films may be deposited on various substrates including, but not limited to, polished silicon wafers and stainless steel porous substrates. Pores may be oriented in any direction, but in one embodiment, the pores may be oriented perpendicular to the surface of the substrate.

Highly ordered MCM-41 having a hollow macrotubule (wormlike) morphology may be prepared as is known in the art. In one embodiment, wormlike MCM-41 may be pressed into a pellet and laser ablated as described herein. Previous attempts to prepare films from MCM-41 materials that had no special morphology via laser ablation were not successful because the high energy laser beam formed defect sites in the MCM-41 framework. This was evidenced by strong luminescence from the target after excimer laser irradiation.

In order to overcome this challenge, a UV absorbing molecule occluded within the molecular sieve framework may prevent the formation of defects. Certain organometallics encapsulated in the molecular sieve may behave as these UV-absorbing guest molecules, which may allow laser ablation of the MCM-41 to occur. For example, template free zeolite UTD-1 does not laser ablate, but rather luminesces upon irradiation. However, as-synthesized UTD-1 that contains the organometallic cobalticinium ion ($CP^*_2Co^+$) readily ablates. The encapsulated $Cp^*_2Co^+$ ion absorbs UV energy and fragments to assist the ablation of UTD-1. This phenomenon, again, may be referred to as guest assisted laser ablation (GALA).

The related ferrocene ($Cp_2Fe$) may also be employed as a template by melting the ferrocene through the MCM-41 pores as described in Example 5. The $Cp_2Fe$ may be expected to be adsorbed in macropores and, to a lesser extent, in mesopores that contain the surfactant template. After absorption of ferrocene, the former white MCM-41 material may appear to be a light brown color. The ferrocene is absorbed into the MCM-41 and is retained after numerous dichloromethane washings. Further evidence for the absorption of the ferrocene into the MCM-41 is obtained by FT-IR spectroscopy.

The ferrocene containing MCM-41 may be irradiated with, in one embodiment, a 248 nm laser beam. The particles in the plume may be deposited on heated (in one embodiment, about 150° C.) substrates. In one embodiment, polished silicon wafers or stainless steel porous supports may be used. The heated substrate may promote adhesion of the MCM-41 laser deposited fragments to the substrate. No other pretreatment process, either chemically or physically, may be needed to promote adhesion to the substrates.

A typical laser ablated MCM-41 film on a silicon wafer that appeared to be continuous and uniform throughout the surface of the silicon wafer. It is interesting to note that no evidence of the worm or tubular morphology present on the PLD film was seen at least at this magnification. Initially, the PLD film was amorphous to x rays, which is consistent with laser ablated films of other molecular sieves.

If desired, films may then be subjected to a post hydrothermal treatment to reorganize the fragments. Treatment may include horizontally inverting and suspending an ablated film in an MCM-41 synthesis gel. By inverting the ablated film in the synthesis gel, the hollow tubes may grow from the PLD film and gravity may encourage straight growth in a downward manner. It was found that if the ablated film was placed face up in a synthesis gel, there was no preferred orientation seen on the film. Rather, the resulting film contained a thick film of the wormlike morphology on the surface of the film. With no inversion in the synthesis gel, even when a cross section of the film was taken, there was still no evidence of oriented worms. Furthermore, when the film was suspended in a position other than a horizontal position, the film showed no evidence of a preferred orientation, generating the same results as placing the film face up in the gel.

Upon removal of the film from the synthesis gel, which, in one embodiment may be after about 5 days, the film may be rinsed with water to remove thick white precipitates generated from bulk synthesis gel that may cover the substrate. After thorough washing of the substrate with water, a thick white film of MCM-41 may remain adhered to the substrate. This white film may be seen accumulating on the substrate surface each day until it is taken out. A cross section of the adhered film may obtained by fracturing the silicon wafer with a diamond scribe.

Figure 4:
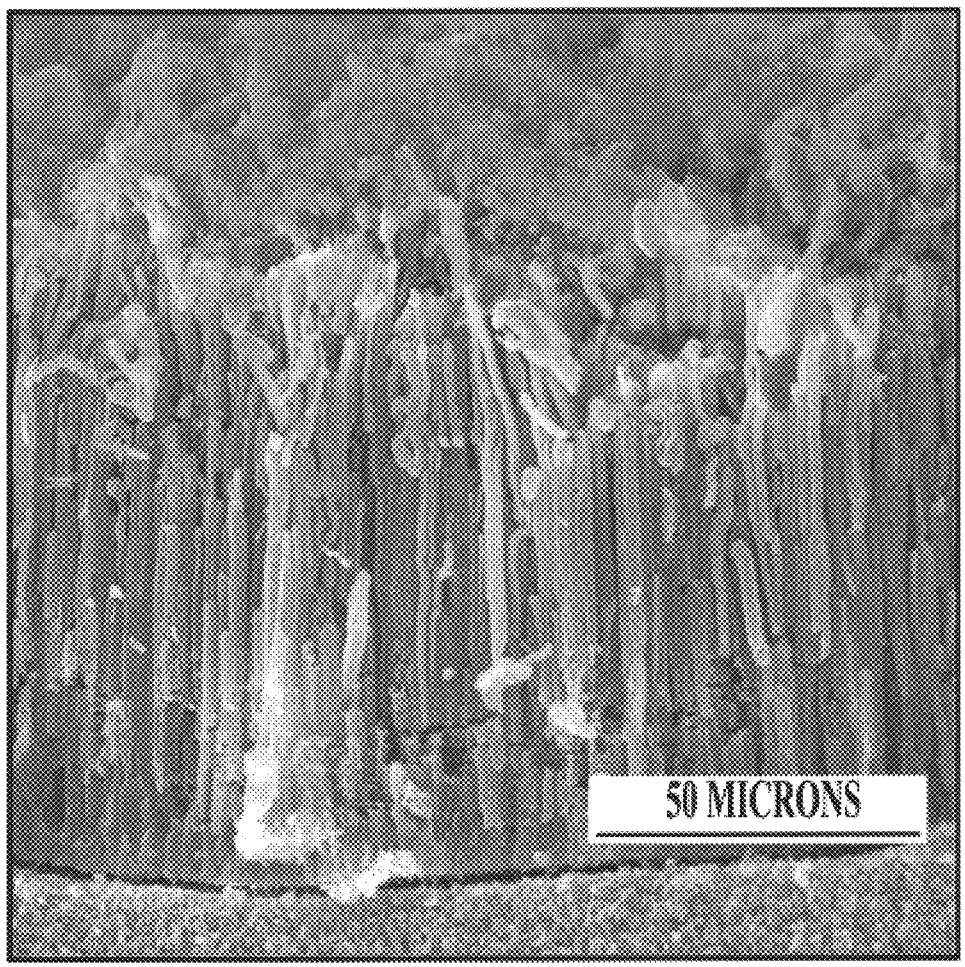
FIGS. 4–5 SEM cross section of oriented MCM-41 mesoporous molecular sieves having wormlike morphology.
Figure 5:
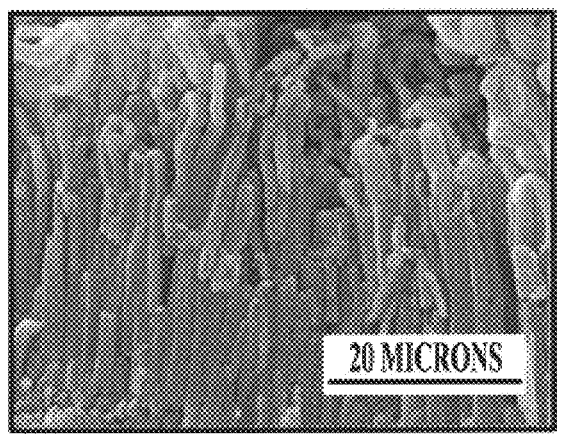

FIGS. 4 and 5 show a SEM micrograph of a cross section of a post hydrothermally treated film looking parallel to the substrate surface. The image revealed densely packed tubules of MCM-41 that were oriented perpendicular to the substrate surface. The tubes may clearly be seen radiating upward from the Si wafer substrate with a rather uniform diameter (about 3 $\mu$m). These tubules were on the order of 200 microns long. Therefore, it may be advantageous for an oriented film to be obtained consisting of shorter worms where the orientation can still be seen at the surface.

Attempts at controlling the thickness of the oriented worm films may include decreasing the length of the post hydrothermal treatment. When the post hydrothermal treatment is decreased to less than about 3 days, however, there may be no observable oriented worms on the substrate. Further, after about 3 days of hydrothermal treatment, long, oriented worms on the order of 150 to 200 $\mu$m may be observed.

Figure 6:
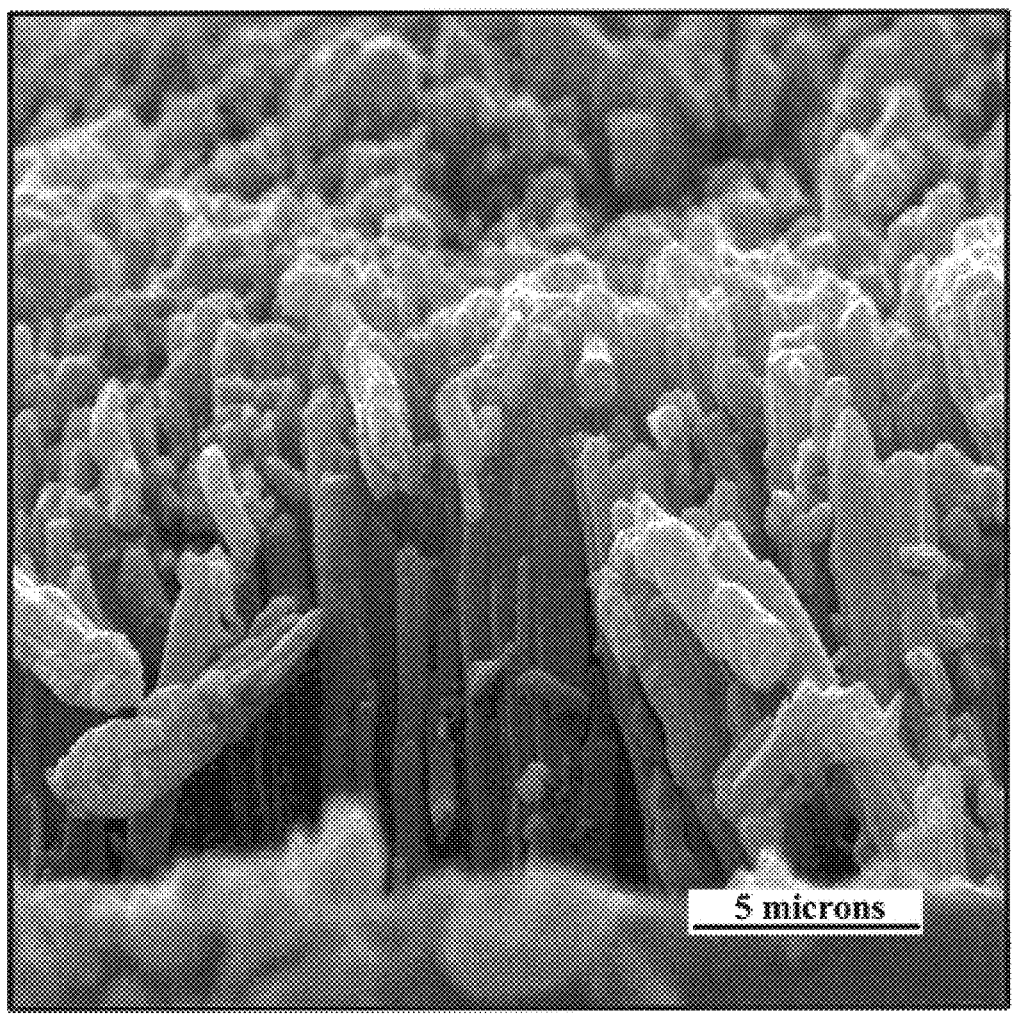
FIG. 6 SEM of oriented short MCM-41 mesoporous molecular sieves having wormlike morphology.

In one embodiment, a short worm orientated film may be achieved by spacing a blank silicon wafer below the PLD film. In one embodiment, the spacing may be about 19 microns. The sandwiched wafers may be clamped together and then hydrothermally treated. In this embodiment, the treatment may be for about 3 days. Upon removal from the hydrothermal treatment, a cross section of the film revealed a oriented worm film on the order of 8 microns thick as shown in FIG. 6. The tubes may be seen radiating upward from the Si wafer substrate with a rather uniform diameter (about 0.3 $\mu$m). Enlargement of the image (not shown) shows the broken ends of some of the tubules, which reveals the tubes are indeed hollow.

A control study has been performed by hydrothermally treating a blank silicon wafer and stainless steel porous support. As in the PLD substrate, thick white precipitates generated from the bulk synthesis gel were found covering the substrates. However, the particles were not adhered to the substrate because they easily flaked off when rinsing with water. Therefore, it may be concluded that the PLD may be needed for adhesion of the film to the substrates. Utilizing the disclosure herein, the thickness of MCM-41 films may be varied from about 8 microns to greater than about 200 microns. The thickness of the films may be controlled using the short worm apparatus described above. The oriented mesoporous macrotubules may have vast potential commercial applications in areas such as, but not limited to, catalysis, biocatalyst, and bioseparations. Specifically, such membranes may be used to separate macromolecules such as large proteins or DNA based on size or electrostatic interactions within the macropores of the oriented tubules.

The following examples are included to demonstrate specific embodiments of the invention. It should be appreciated by those of skill in the art that the techniques disclosed in the examples which follow represent techniques discovered by the inventors to function well in the practice of the invention, and thus can be considered to constitute specific modes for its practice. However, those of skill in the art will, with the benefit of the present disclosure, appreciate that many changes may be made in the specific embodiments which are disclosed and may still obtain a like or similar result without departing from the spirit and scope of the invention.

EXAMPLE 1

Preparation of Oriented Zeolite UTD-1 Membranes via Pulsed Laser Ablation

An all-silica UTD-1 zeolite was synthesized according to published procedures by first combining 0.058 g of NaOH in 13.5 mL of deionized $H_2O$ with 2.0 mL of a 29% aqueous solution of bis(pentamethylcylopentadienyl)cobalt(III) hydroxide ($Cp^*_2CoOH$). The template solution was then mixed with 0.82 g of fumed silica and stirred at room temperature for about 1 hour. The pH of the synthesis gel should be between about 11.2 and 11.5. Further adjustment of the gel pH may be made with dropwise addition of a 5 M NaOH solution if necessary. The final gel having a molar ratio of $0.05NaOH:1.0SiO_2:0.13Cp^*_2CoOH:60H_2O$ was transferred to a Teflon lined stainless steel autoclave (Parr) and heated under static conditions for about 2 days. The resulting yellow crystals were suction filtered, washed with deionized water, and dried in air at room temperature.

Zeolite UTD-1 targets were prepared by pressing a pellet about 2.5 cm in diameter that was then placed into a control atmosphere chamber positioned about 2.5 cm above the substrate at an angle of about 40°. A Lumonics HyperEx-400 excimer laser (248 nm, KrF*) was used to ablate the molecular sieve target which results in ejected particles that deposit on a temperature-controlled substrate. The laser energy in the range of about 55 to about 125 mJ/pulse was measured with a Scientech pyroelectric head (Model 380402). A computer-controlled rastering mirror (Oriel) was used to reflect the laser beam 90° and raster the beam across the target material over an area of about 5 mm. A focusing lens was used to decrease the spot size of the laser beam to about 0.001 $cm^2$. During an ablation study only fresh as-synthesized UTD-1 target surface was ablated by using about a 14 ns pulse length with an energy output of about 70–150 mJ/pulse and a repetition rate of about 10 Hz. The substrates were polished silicon wafers (Texas Instruments, Inc.) and a porous 316L stainless steel disk of dimensions about 6×1.5 mm with a porosity of about 0.5 $\mu m$ (Mott Metallurgical, Inc.). The substrate was heated to about 160 degrees Celsius, and a background pressure of $O_2$ was maintained at about 150 mTorr. The rate of UTD-1 deposition under these conditions was about 130 nm/min.

Post hydrothermal treatment on the laser-deposited films was carried out by first preparing a UTD-1 synthesis gel as described above. The UTD-1 film on silicon was positioned in the reaction vessel tilted at an angle of about 60° with the laser-deposited film facing down as to minimize having material deposit from the gel onto the wafer. The UTD-1 coated stainless steel disk was placed in a Teflon holder with the clean side covered with Teflon tape to prevent material from depositing in the frit pores. The UTD-1 films were hydrothermally treated at about 175° C. for 18, 24, and 72 hours with a growth rate of about 0.2 $\mu m$ per hour. After hydrothermal treatment, the films were washed with deionized water and air dried. It should be noted that without protecting the clean frit surface, the pores may become clogged.

The porous stainless steel disk with the reorganized UTD-1 membrane was calcined at about 550° C. for about 6 hours to decompose the organometallic template and then the membrane was carefully washed several times with concentrated HCl to remove the residual cobalt. The membrane with an effective disk area of 31.6 $mm^2$ was then mounted with epoxy (Devcon High strength 2 ton white epoxy) in a glass tube having a 10 mm diameter containing a course grade glass frit. The separation of heptane and toluene was conducted by placing a 1:1 mixture (v/v) in contact with the membrane at room temperature. The permeation side was kept at a constant partial vacuum of ~30 $\mu m$. The permeate was collected in a liquid nitrogen cold trap and analyzed by GC.

EXAMPLE 2

Membrane Separation

An attractive property of inorganic microporous membranes is selectivity; however, the diffusion through the micropores may be a relatively slow process. This means that very thin membranes may be required for reasonable fluxes to be observed. The laser-ablation method readily allows for control of deposit thickness, and submicron thick membranes may be readily prepared. In the present Example, the UTD-1 membranes may be more than an order of magnitude too thick to obtain useful fluxes. However, one goal of this Example was to evaluate the selectivity for an important model separation.

There is great interest in a membrane-based process for the separation of paraffin and aromatics generated in reforming reactions. One such application that requires the use of pure paraffins is the manufacture of detergents, in which paraffins serve as the alkyl constituent of sulfonated alkaryl and alkyl sulfonate synthetic detergents. Linear paraffins may be preferred due to their superior detergent properties as well as better biodegradability over synthetic detergents made with branched paraffins. Other important uses of linear paraffins may be their use in flame-proofing agents, solvents, and plasticizers. Therefore, as a model for this type of separation, a mixture of n-heptane and toluene has been selected.

Preliminary separation studies with a heptane/toluene (1:1 v/v) mixture were performed at room temperature with the feed in liquid form at atmosphere pressure while the down stream side was kept at a reduced pressure of about 30 mTorr. The permeated mixture was collected and sampled at different time intervals. The average mole percent of the heptane feed component was 38%. The mole percent of the heptane in the permeate collected at 3.5, 5.0, 7.0 and 14 hours was 52%, showing an enrichment of the paraffin over the aromatic by a factor of about 1.5. One would not expect exclusion of one of these components based on size or shape because of the extra large pores; however, the differing affinities of molecules with the pore openings may play a role in separation.

Zeolites that have been employed in adsorption-type separations of paraffins and aromatics such as X- and Y type zeolites also favor the paraffin over aromatics. One may, with the benefit of the present disclosure, improve the selectivity by altering the UTD-1 framework composition. Additionally, there are a host of other commercially relevant separations that may be performed with UTD-1 membranes prepared in accordance with the present disclosure.

EXAMPLE 3

Oriented MAPO-39 Film

Figure 7A:
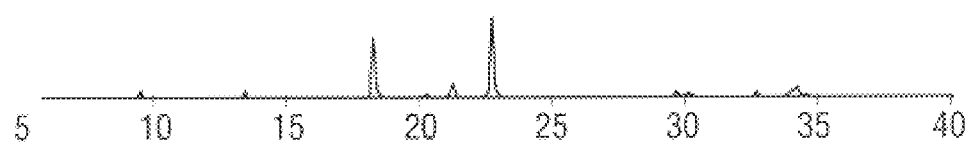
FIG. 7 Powder x-ray diffraction pattern of bulk MAPO-39 as synthesized and powder x-ray diffraction pattern of thin film MAPO-39 after hydrothermal treatment.
Figure 7B:
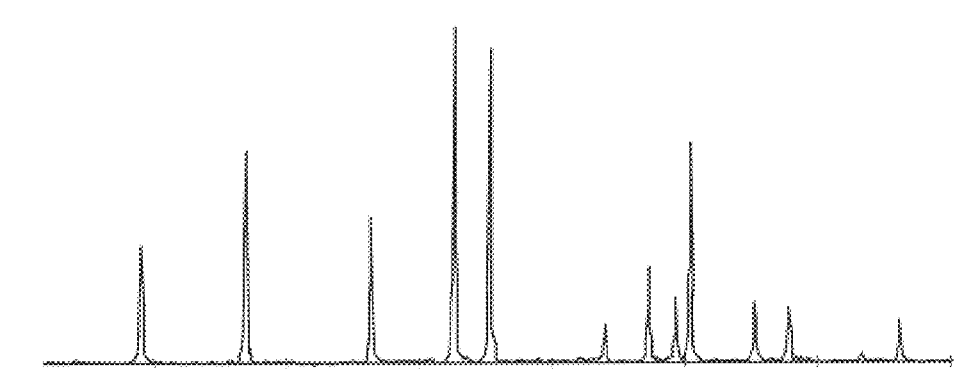
Figure 8:
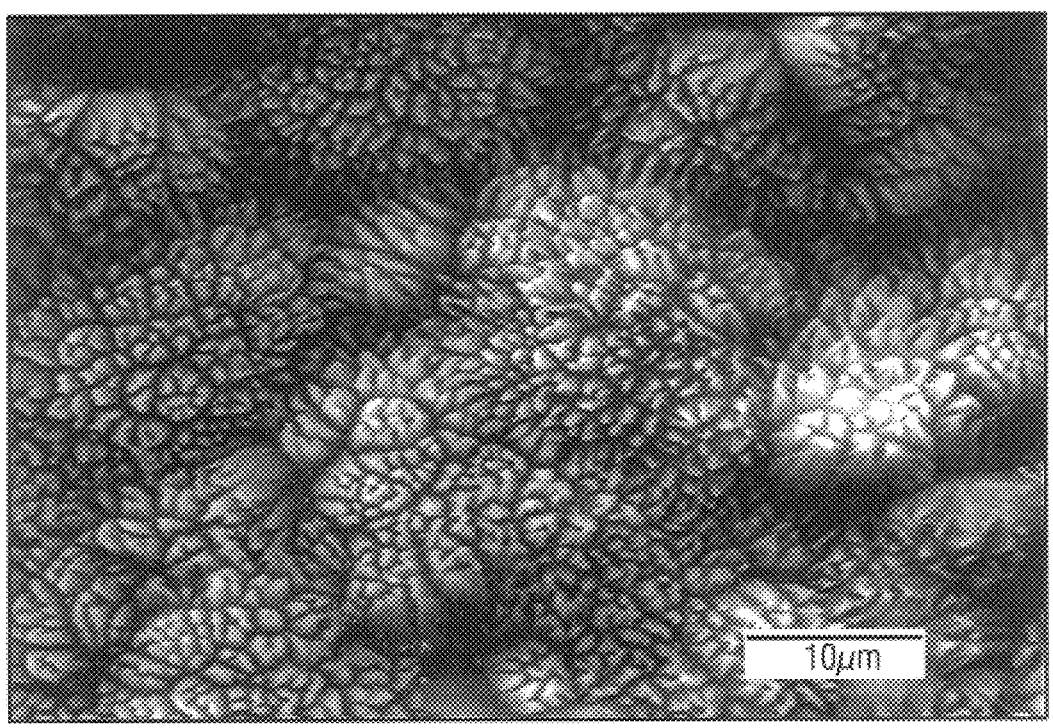
FIG. 8 SEM of oriented MAPO-39 zeolite thin film.
Figure 9:
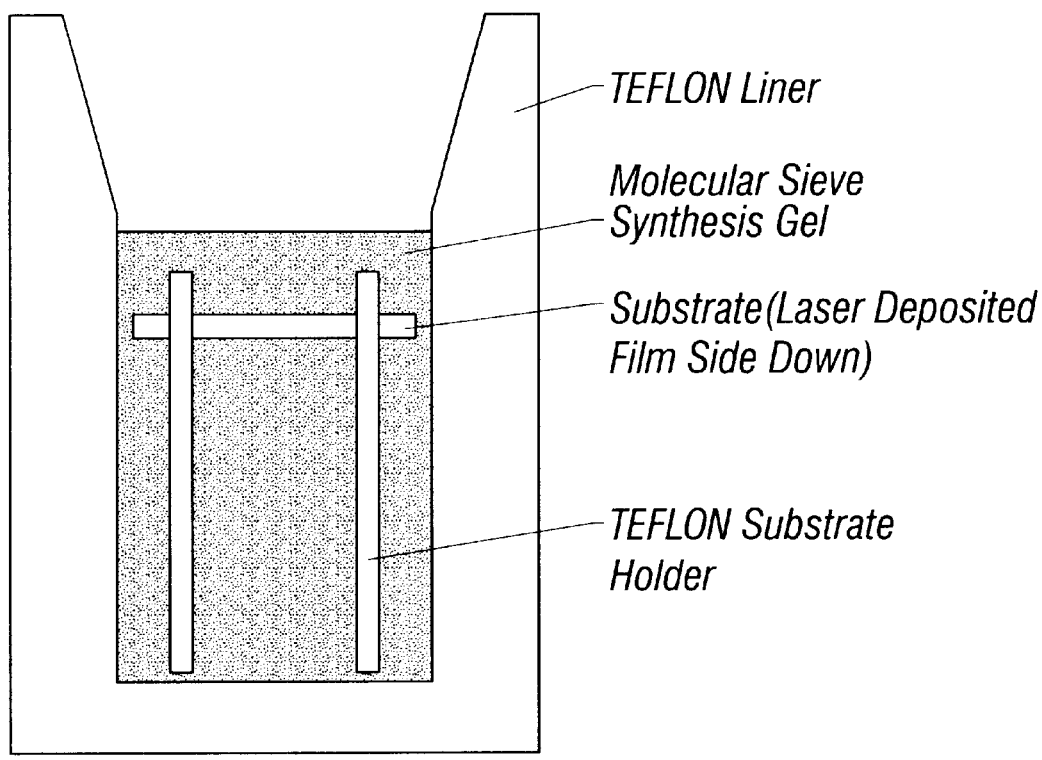
FIG. 9 Schematic of reactor in accordance with one embodiment of the present disclosure.

A small target of as-synthesized MAPO-39 was prepared and irradiated using a 248 nm KrF* excimer laser to produce a laser deposited thin film on a porous metal substrate under the following conditions: about 105 mJ/pulse, repetition rate of about 10 Hz, substrate temperature of about 150° C., background pressure of about 300 mTorr $O_2$, and ablation time of about 16 minutes. The laser deposited film was reorganized by post hydrothermal treatment by placing the ablated film into the MAPO-39 synthesis gel with molar ratios of the oxides: 1 $C_6H_{15}NO$:0.167 MgO:0.917 $Al_2O_3$,:1 $P_2O_5$:39.8 $H_2O$. The film was placed in to the synthesis gel at an angle of about 40°, with the ablated side facing down in the synthesis gel. This gel was placed in a Teflon lined high pressure reactor and heated under static conditions at about 150° C., for about 24 hours. After post hydrothermal treatment, the thin film is washed with water and allowed to air dry. FIG. 7 shows the powder X-ray diffraction patters of bulk MAPO-39 as synthesized material, and of the post hydrothermally treated thin film. FIG. 8 is an SEM of the oriented MAPO-39 zeolite thin film.

EXAMPLE 4

Separation using MAPO-39

The separation of a 1:1 (v/v) mixture of water and ethanol has been conducted at room temperature using the membrane in Example 3 with the feed components in liquid form at atmospheric pressure, while the downstream side was held at a reduced pressure of about 30 mTorr. The permeate was condensed at liquid nitrogen temperatures, and analyzed by gas chromatography. The initial mole percent of water in the separation experiment was 69%. The separation afforded 99 mole percent water in about 4 to 8 hours or a water enrichment factor of 1.3.

EXAMPLE 5

Oriented Films of Mesoporous MCM-41 Macroporous Tubules

The MCM-41 hollow tubular material was prepared according to published procedure. A mixture of sodium silicate (2.50 g) and deionized water (6.24 ml) was stirred at room temperature for thirty minutes in a 250 mL plastic beaker. Concentrated $H_2SO_4$ was added drop-wise to the sodium silicate solution until a pH of about 10 was obtained ( about 0.5 mL), and the white gel was stirred at room temperature for an additional thirty minutes. Concurrently, in a separate beaker, 98% CTAB (2.17 g) was dissolved in deionized water (11.10 mL) and stirred at room temperature for one hour. The sodium silicate solution and the CTAB template solution were then combined and stirred at room temperature for about one hour. The pH of the resulting synthesis gel was in the range of about 11.45 to about 11.50. The gel, having a molar ratio of $SiO_2$:CTAB:$H_2SO_4$:$H_2O$ of 1:1:0.27:164, was loaded into a Teflon lined Parr reactor and heated under static conditions at about 100° C. for about 24 hours. The reactor was then cooled to room temperature and the pH was adjusted to a reading between about 9.5 and about 10 using a 5% $H_2SO_4$ solution while stirring at a moderate speed for about thirty minutes. The gel was heated again at about 100° C. for another 24 hours. This step was repeated for 5 days. The resulting white solid was suction filtered, washed with deionized water until no traces of the surfactant were evident, and then dried at room temperature.

Freshly sublimed ferrocene (0.6 g) and as-synthesized MCM-41 (0.84 g) were loaded into a 23 mL Teflon lined Parr reactor. The reactor was heated at about 130° C., which is above the melting point of ferrocene, for about 24 hours. After cooling to room temperature, the resulting brown solid was washed with dichloromethane until a colorless filtrate was obtained. The light brown product was dried at room temperature for about 24 hours.

The setup for pulsed laser deposition of molecules has been described above. A 2.5 cm pressed pellet of as-synthesized MCM-41 was mounted in a controlled atmosphere chamber and irradiated using a KrF (248 nm) pulsed Lumonics excimer laser. Typical experimental conditions were as follows: laser influence was about 116.8 mJ/pulse, repetition rate was about 10 Hz, substrate temperature was about 185° C., background pressure was about 150 mTorr, and deposition time was about 8 min. The films were deposited onto polished silicon wafers or stainless steel porous substrates.

The PLD films derived from MCM-41 were inverted and suspended horizontally in a 23 ml Teflon lined Parr reactor which contained a MCM-41 synthesis gel having a molar ratio of $SiO_2$:CTAB:$H_2SO_4$:$H_2O$ of 1:1:0.27:164. The reactor was placed in an oven and heated under static conditions at about 100° C. for about 24 hours. Then, the reactor was cooled to room temperature, and the film was removed from the solution and set aside. The synthesis gel, having a pH of about 11.3 to about 11.6, was very viscous and difficult to stir; however, the gel became liquified as the pH was adjusted to a reading between about 9.5 and about 10 using a 5% $H_2SO_4$ solution while stirring for thirty minutes. The film was resuspended horizontally inverted in the gel and was heated at about 100° C. for another 24 hours. This step was repeated for 5 days. The films were removed from the gel after the fifth day, washed with deionized water to remove any loose particles were removed from the film, and allowed to air dry at room temperature.

Thin films were fabricated from two Si wafers (one that contained the ablated film and one blank) sandwiched together with a 19 micron Mylar film between them. The wafers, held together by a paper clip, were subjected to the hydrothermal treatment as described above with the ablated film horizontally suspended and inverted in the synthesis gel.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed compositions and methods may be utilized in various combinations and/or independently. Thus the invention is not limited to only those combinations shown herein, but rather may include other combinations.

REFERENCES

The following references, to the extent that they provide exemplary procedural or other details supplementary to those set forth herein, are specifically incorporated herein by reference.

Balkus and Gimon Kinsel, Micropor. Mater., 20:67,1998.
Balkus and Gimon Kinsel, Micropor. Mesopor. Mater., 28:113, 1999.
Balkus, Ball, Gimon-Kinsel, Anthony, Gnade, Sens. Actuators B., 42:67, 1997.
Balkus, Ball, Gnade, Anthony, Chem. Mater., 9:380, 1997.
Balkus, Biscotto, Gabrielov, Stud. Surf. Sci. Catal., 105:415, 1997.
Balkus, Gabrielov, Sandler, Mater. Res. Soc. Symp. Proc., 368:369, 1995.
Balkus, Gabrielov, Zones, Chan, Chem. Ind., 69:77, 1996.
Balkus, Khanmamedova, Scott, Hoefelmeyer, Proc. of 12th Int. Zeolite Conf., 1998.
Balkus, Munoz, Gimon Kinsel, Chem. Mater., 10:464, 1998.
Balkus, Riley, Gnade, Mater. Res. Soc. Symp. Proc., 351:437, 1994.
Balkus, Sottile, Riley, Gnade, Thin Solid Films, 260:4, 1995.
Bein, Chem. Mater., 8:1636, 1996.
Boudreau and Tsapatsis, Chem. Mater., 9:1705, 1997.
Cheng, Lin, Yang, Yang, Xu, Li, Chin. Sci. Bull., 42:37, 1997.
Cheng, Lin, Yang, Yang, Xu, Li, Stud. Surf. Sci. Catal., 105:2233, 1997.
Chrise and Hubler (Eds.), In: Pulsed Laser Deposition of Thin Films, Wiley, New York, 1994.
Corma, Kan, Navarro, Maria, Perez Pariente, Rey, J. Chem. Mater., 1213, 1997.
Coronas, Falconer, Noble, AIChE J., 43:1797, 1997.
Davis, Burket, Mendelson, Mann, Nature, 385:420, 1997.
Elder and White, Chem. Mater., 5:1226, 1997.
Feng, Huo, Petroff, Stucky, Appl. Phys. Lett., 13:1887, 1997.
Freyhardt, Tsapatsis, Lobo, Balkus, Davis, Nature, 381:295, 1996.
Gaub, Science, 270:1480, 1995.
Getus, den Exter, van Bekkum, J. Chem. Soc., Faraday Trans., 88:3101, 1992.
Gimon Kinsel, Munoz, Ayala, Washmon, Balkus, Proc. 12th Int. Zeolite Conf., Materials Research Society, PA 1999, pp1779.
Gimon-Kinsel, Groothius, Balkus, Micropor. Mesopor. Mater., 20:67, 1998.
Hillhouse, Okubo, Egmond, Tsapatsis, Chem. Mater., 9:1505, 1997.
Jansen and Coker, Curr. Opin. Solid State Mater. Sci., 1:65, 1996.
Jansen, Kashciev, Erdem-Senatalar, Stud. Surf. Sci. Catal., 85:215, 1994.
Jansen, Nugroho, van Bekkum, In: Proc. of the 9th Int.'l Zeolite Conf. Montreal, von Ballmoos et al. (Eds.), Butterworth-Heinemann, Boston, p 239, 1992.
Jia, Chen, Noble, Falconer, J. Membr. Sci., 90:1, 1994.
Karlsson, Schmidt, Stocker, Mater. Res. Soc. Symp. Proc., 454:113, 1997.
Katsukaba, Murata, Kuroda, Morooka, J. Chem. Eng. Jpn., 30:72, 1997.
Koegler, Arafar, van Bekkum, Jansen, Stud. Surf Sci. Catal., 105:2163, 1997.
Kolsch, Noack, Lieske, Toussaint, Caro, Stud. Surf. Sci. Catal., 84:1075, 1994.
Kondo, Komori, Kita, Okamoto, J. Membr. Sci., 133:133, 1994.
Lobo, Tsapatsis, Freyhardt, Khodabandeh, Wagner, Chen, Balkus, Zones, Mark, J. Am. Chem. Soc., 119:8474, 1997.
Lu, Gangui, Drewien, Anderson, Brinker, Gong, Guo, Soyez, Dunn, Huang, Zinks, Nature, 389:364, 1997.
Lui, Bontha, Kim, Baskaran, Mater. Res. Soc. Symp. Proc., 431:245, 1996.
Matsukata, Nishiyama, Ueyama, J. Chem. Soc., Chem. Commun., 339, 1994.
Matsukata, Nishiyama, Ueyama, Stud. Surf. Sci. Catal., 84:1183, 1994.
Mintova, Valtchev, Engström, Schoeman, Sterte, Micropor. Mater., 11:149, 1997.
Moller and Bein, J. Chem. Mater., 10:2950 and references there in, 1998.
Mou and Lin, Science, 273:765, 1996.
Munoz and Balkus, J. Am. Chem. Soc., 121:139, 1999.
Nishiyama, Koide, Egashira, Ueyama, J. Chem. Soc. Chem. Commun., 2147 2148, 1998.
Nishiyama, Matsufuji, Ueyama, Matsukata, Micropor. Mater., 12:293, 1997.
Nishiyama, Ueyama, Matsukata, Ceram. Process., 43:2724, 1997.
Nishiyama, Ueyama, Matsukata, J. Chem. Soc., Chem. Commun., 1967, 1995.
Nishiyama, Ueyama, Matsukata, Micropor. Mater., 7:299, 1996.
Nishiyama, Ueyama, Matsukata, Stud. Surf. Sci. Catal., 105:2195, 1997.
Ozin, Kresge, Hong, Stud. Surf. Sci. Cat., 117:119, 1998.
Ozin, Yang, Sokolov, Adv. Mater., 9:662, 1997.
Ozin, Yang, Sokolov, Coombs, J. Mater. Chem., 8:1205, 1998.
Plee, U.S. Pat. No. 5,731,488, 1996.
Rose, Patel, Lovell, Muir, Mann, Chem. Commun., 7:829, 1998.
Sano, Kiyozumi, Kawamura, Mizukami, Takaya, Mouri, Inaoka, Toida, Watanabe, Toyoda, Zeolites, 11:842, 1991.
Sano, Kiyozumi, Maeda, Toba, Niwa, Mizukami, J. Mater. Chem., 2:141, 1992.
Schreiner, Britton, Dickson, Pehler, U.S. Pat. No. 5,220,099, 1993.
Scott and Balkus, Chem. Mater., 11:189, 1999.
Sottile, Balkus, Riley, Gnade, Mater. Res. Soc. Symp. Proc., 371:33, 1995.
Tolbert, Firouzi, Stucky, Science, 278:264, 1997.
Tsikoyiannis and Haag, Zeolites, 12:126, 1992.
van de Graaf, Kapteijin, Mouligin, Chem. Ind., 71:543, 1998.
Xu, Dong, Li, Li, Wu, J. Chem. Soc. Chem. Commun., 755, 1990.
Yan, Tsapatsis, Gavalas, Davis, J. Chem. Soc., Chem. Commun., 227, 1995.
Yang et al., Nature, 379:703, 1996.
Yang, Coombs, Ozin, Nature, 386:692, 1997.
Yang, Kuperman, Coombs, Mamiche Afara, Ozin, Nature, 379:703, 1997.
Zhao, Yang, Margolese, Stucky, Chem. Soc. Chem. Comm., 22:2499, 1998.
Zho, Lu, Zhao, J. Phys. Chem. B., 102:7371, 1998.

What is claimed is:

1. A method of forming a perpendicularly-oriented non UTD-1 film on a substrate, comprising:

providing a target comprising a zeolite other than UTD-1;

ablating material from the target onto the substrate to form a non UTD-1 film;

heating the non UTD-1 film in a synthesis gel of the target; and orientating the non UTD-1 film, with the heating, so that its pore structure is substantially perpendicular to the substrate, thereby forming the perpendicularly-oriented non UTD-1 film on the substrate.

2. The method of claim 1, wherein the target comprises at least one of ZSM-5, Beta, Mordenite, NaX, NaA, SSZ-33, SSZ-31, SSZ-42, MCM-22, or a mixture thereof.

3. The method of claim 1, wherein the film is heated with the film being positioned face down at an angle between about 0 degrees and about 60 degrees in a reactor, the angle being measured from a plane horizontal to the reactor.

4. The method of claim 1, further comprising adjusting a background pressure of the substrate to between about 150 mTorr and about 350 mTorr.

5. The method of claim 4, wherein the background pressure comprises a background pressure of $O_2$.

6. The method of claim 1, wherein the substrate comprises a porous substrate.

7. The method of claim 1, wherein the substrate comprises a zeolite crystal, glass, metal, metal oxide, or plastic.

8. The method of claim 1, further comprising separating liquids or gases with the film.

9. A method of forming a perpendicularly-oriented non UTD-1 film on a substrate, comprising:

providing a target comprising a zeolite other than UTD-1, the target further comprising $CP*_2Co^+$ or $Cp_2Fe$;

directing pulsed laser radiation having an energy between about 70 mJ/pulse and about 200 mJ/pulse at a repetition rate of between about 1 Hz and about 50 Hz to the target to create a plume;

heating the substrate;

maintaining a pressure between about 150 mTorr and about 350 mTorr about the substrate;

placing the substrate in operative relation to the plume to deposit target material onto the substrate to form a non UTD-1 film;

heating the non UTD-1 film in a synthesis gel of the target; and orientating the non UTD-1 film, with the heating, so that its pore structure is substantially perpendicular to the substrate, thereby forming the perpendicularly-oriented non UTD-1 film on the substrate.

* * * * *

UNITED STATES PATENT AND TRADEMARK OFFICE
CERTIFICATE OF CORRECTION

PATENT NO.    : 6,472,030 B1
DATED         : October 29, 2002
INVENTOR(S)   : Balkus, Jr. et al.

It is certified that error appears in the above-identified patent and that said Letters Patent is hereby corrected as shown below:

<u>Column 18,</u>
Line 6, please delete "$CP*_2Co^+$" and insert -- $Cp*_2Co^+$ -- therefor.

Signed and Sealed this

Twenty-ninth Day of April, 2003

JAMES E. ROGAN
*Director of the United States Patent and Trademark Office*